(12) United States Patent
He et al.

(10) Patent No.: US 9,951,435 B2
(45) Date of Patent: Apr. 24, 2018

(54) COATING PACKAGED CHAMBER PARTS FOR SEMICONDUCTOR PLASMA APPARATUS

(71) Applicant: Advanced Micro-Fabrication Equipment Inc, Shanghai, Shanghai (CN)

(72) Inventors: Xiaoming He, Shanghai (CN); Lei Wan, Shanghai (CN); Zhaoyang Xu, Shanghai (CN); Ping Yang, Shanghai (CN); Hanting Zhang, Shanghai (CN)

(73) Assignee: ADVANCED MICRO-FABRICATION EQUIPMENT INC, SHANGHAI, Shanghai (CN)

( * ) Notice: Subject to any disclaimer, the term of this patent is extended or adjusted under 35 U.S.C. 154(b) by 0 days.

(21) Appl. No.: 15/445,714

(22) Filed: Feb. 28, 2017

(65) Prior Publication Data

US 2017/0241038 A1   Aug. 24, 2017

Related U.S. Application Data

(62) Division of application No. 14/066,584, filed on Oct. 29, 2013, now Pat. No. 9,617,633.

(30) Foreign Application Priority Data

Oct. 29, 2012  (CN) .......................... 2012 1 0421401

(51) Int. Cl.
*C23C 28/04* (2006.01)
*C25D 11/24* (2006.01)
*C23C 14/30* (2006.01)
*C23C 14/08* (2006.01)

(52) U.S. Cl.
CPC .......... *C25D 11/246* (2013.01); *C23C 14/083* (2013.01); *C23C 14/30* (2013.01); *C23C 28/044* (2013.01)

(58) Field of Classification Search
CPC .................................................... C23C 28/044
See application file for complete search history.

(56) References Cited

U.S. PATENT DOCUMENTS

| | | | | |
|---|---|---|---|---|
| 6,805,952 B2 * | 10/2004 | Chang | ....... | C23C 4/00 118/723 R |
| 2004/0002221 A1 * | 1/2004 | O'Donnell | ....... | C23C 16/4404 438/710 |
| 2004/0214026 A1 * | 10/2004 | Harada | ....... | B01J 19/02 428/469 |
| 2004/0229078 A1 * | 11/2004 | Maeda | ....... | C23C 4/02 428/650 |
| 2005/0056218 A1 * | 3/2005 | Sun | ....... | C04B 41/009 118/715 |

* cited by examiner

*Primary Examiner* — Bryan D. Ripa
(74) *Attorney, Agent, or Firm* — Womble Bond Dickinson (US) LLP; Joseph Bach, Esq.

(57) ABSTRACT

An advanced coating for parts used in plasma processing chamber. The advanced coating is formed over an anodized surface that has not been sealed. After the coating is formed, the coated area is masked, and the remaining anodized surface is sealed. The porous and rough structure of the anodized but un-sealed aluminum enhances adhesion of the coating. However, to prevent particle generation, the exposed anodized surface is sealed after formation of the coating. The coating can be of yttria, formed by plasma enhanced atomic deposition techniques which results in a dense and smooth coating.

18 Claims, 4 Drawing Sheets

COATING PACKAGED CHAMBER PARTS FOR SEMICONDUCTOR PLASMA APPARATUS

This application is a divisional of U.S. patent application Ser. No. 14/066,584, filed on Oct. 29, 2013, which claims priority of Chinese Patent Application No. 201210421401.5, entitled "COATING PACKAGED CHAMBER PARTS FOR SEMICONDUCTOR PLASMA APPARATUS", filed with the Chinese Patent Office on Oct. 29, 2012, both of which are incorporated by reference in their entirety herein.

BACKGROUND

1. Field

The subject invention relates to plasma processing chambers and, in particular, to a coating for various parts of a plasma processing chamber, which enhances the corrosion resistance of the parts in the presence of active plasma species.

2. Related Art

In plasma processing chambers, a showerhead is often used to inject the process gas. In certain plasma chambers, such as capacitively-coupled plasma chambers, the showerhead may also function as an electrode, coupled to either ground or RF potential. However, during processing the showerhead is exposed to the plasma and is attacked by the active species within the plasma, such as halogen plasma of $CF_4$, $Cl_2$, etc. This phenomenon is especially troublesome for showerheads having a chemical vapor deposited silicon carbide coating (CVD SiC).

Another chamber part that is exposed to plasma is the chuck, such as an electrostatic chuck (ESC). The ESC generally functions as the lower electrode for the RF power and the wafer holder. Being exposed to the plasma within the chamber, the ESC suffers plasma corrosive attack and wafer abrasion in the plasma processes. Therefore, the surface of ESC has to be hard and stable in the plasma etching process. However, the current ESC surface is usually made of solid ceramics, such as $Al_2O_3$ or AlN pucks, which can be eroded by plasma and induce contamination during plasma processes.

Other parts contacting plasma within the chamber may be, for example, focus ring, plasma confinement ring, chamber liner, etc. Of particular interest is the parts made of anodized aluminum.

Various coatings have been proposed and tested in the prior art for protecting the showerhead and ESC from plasma erosion. Yttria ($Y_2O_3$) coating is believed to be promising; however, it has been very difficult to find a process that results in good coating, especially one that does not crack or generate particles. For example, there have been proposals to use plasma spray (PS) to coat chamber parts made of metal, alloy or ceramic. However, conventional PS $Y_2O_3$ coating is formed by the sprayed $Y_2O_3$ particles, and generally results in a coating having high surface roughness (Ra of 4 micron or more) and relatively high porosity (volume fraction is above 3%). The high surface roughness and porous structure makes the coating susceptible to generation of particles, which may contaminate the wafer being processed. In addition, particles will come out from the gas holes and drop on the wafer when the as-coated shower head is used in the plasma process, as the plasma sprayed coating inside the gas hole is very rough and poorly adheres to the substrate.

In addition, PS $Y_2O_3$ is usually deposited on Al alloy parts whose surface has been previously anodized. Since the adhesion of PS $Y_2O_3$ to anodized surface is poor, the anodized layer has to be removed from the parts prior to PS $Y_2O_3$ deposition, which increases the production cost. That is, in the prior art it is conventional to anodize and then seal the anodized chamber part. Then, the anodization is removed from the area of the part that would be exposed to plasma inside the chamber. The now exposed area is coated with PS $Y_2O_3$, so as to avoid adhesion problems of yttria to anodized aluminum.

Another shortcoming is the poor structure stability of thick PS $Y_2O_3$ coating that tends to crack when the service temperature is increased, as the thermal expansion coefficient of $Y_2O_3$ and Aluminum alloy are quite different.

Other proposals for forming Yttria coating involve using chemical vapor deposition (CVD), physical vapor deposition (PVD), ion assisted deposition (IAD), active reactive evaporation (ARE), ionized metal plasma (IMP), sputtering deposition and plasma immersion ion process (PIIP). However, all these deposition processes have some technical limitations such that they have not been actually used to scale up for the deposition of thick coating on the chamber parts for the plasma attack protections. For instance, CVD of $Y_2O_3$ can not be carried out on substrates that cannot sustain temperatures above 600° C., which excludes the deposition of plasma resistant coating on chamber parts that are made of aluminum alloys. PVD process, such as evaporation, can not deposit dense and thick ceramic coating because of their poor adhesion to substrate. Other deposition processes can not deposit thick coating either due to the high stress and poor adhesion (such as sputtering deposition, ARE and IAD) or the very low deposition rate (such as sputtering deposition, IMP and PIIP). Therefore, so far no satisfactory coating has been produced, that would have good erosion resistance, while generating low or no particles and can be made thick without cracking or delamination.

In view of the above-described problems in the art, a solution is needed for a coating that resists plasma species attack and does not generate particle or cracks. The coating should have acceptable roughness and porosity values, so that it could provide long service life. The process for fabricating the coating should allow thick coating without being susceptible to cracking or delamination.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

According to an aspect of the invention, methods are provided for the formation of plasma resistant coatings on anodized chamber parts. According to various embodiments, the process of the coating on the part's surface is provided so that the service performance of the coated part is improved. Other embodiments involve the modification and installation of the coated parts into the plasma chamber, so as to improve the plasma process quality.

According to one example, an aluminum chamber part is first anodized. However, unlike conventional anodizing process, the anodized part is not sealed. Rather, after the anodization process, which remains relatively rough and porous surface, a plasma resistant coating is formed over the area of the part that will be exposed to plasma during service. As different from the conventional plasma sprayed coatings, the plasma resistant coating as mentioned here is called an advanced plasma resistant coating (simply called as A-coating), e.g. A-$Y_2O_3$, A-$YF_3$ or A-$Al_2O_3$ based coatings. Thereafter, the areas of the anodized part that are not coated will be sealed or not depending on the requirement.

Various features of disclosed embodiments include (i) the formation of chamber components with specified roughness; (ii) the formation of special anodized components; that is, the anodized surface is formed without the conventional post-sealing process, but rather keeping the rough and porous anodized surface; (iii) the deposition of A-coating (such as A-$Y_2O_3$) on the un-sealed anodized surface of the chamber components; and (iv) the sealing of the uncoated but anodized surface of the chamber components. Action (iv) may not be performed on the part according to the service requirement. The final formed components may have one or two kinds of surfaces, i.e., either it is completely coated with A-$Y_2O_3$, in which case no anodized surface is exposed, or it has yttria coated surface and anodized surface.

In an exemplary process, an advanced Yttria coating, e.g., $Y_2O_3$ or $YF_3$ based coatings, with fine/compact grain structure and random crystal orientation is created by a plasma enhanced physical vapor deposition (PEPVD) process and is coated on the showerhead that is made of Al alloy, in which (1) the deposition is carried out in a low pressure or vacuum chamber environment; (2) at least one deposition element or component is evaporated or sputtered out off a material source and the evaporated or sputtered material condenses on the substrate surface (this part of the process is a physical process and is referred to herein as the physical vapor deposition or PVD part); (3) meanwhile, a plasma source (or sources) is (are) used to emit out ions and to generate plasma that surrounds the showerhead surface and at least one deposition element or component is ionized and reacted with the evaporated or sputtered elements or components in plasma or on the surface of the showerhead; and (4) the showerhead is coupled to a negative voltage, such that it is bombarded by the ionized atoms or ions during the deposition process. The actions from (3) and (4) are referred to as the "plasma enhanced (PE)" function of the PEPVD.

It should be mentioned that the plasma source(s) could be used either (1) to ionize, decompose, and activate the reactive gases so that the deposition process can be performed in a low substrate temperature and with a high coating growth rate as more ions and radicals are generated by plasma, or (2) to generate the energetic ions aimed at the showerhead so that the ion impinges on the surface of the shower head and helps to form the thick and dense coatings thereon. More perfectly, the plasma sources will be used as the alterative or the combinations of functions (1) and (2), to lead the formation of the coating on the shower head. Such a coating synthesized with the enough thickness and the dense structure is generally referred to herein as "advanced coating" (e.g. A-coating), for instance, such as A-$Y_2O_3$, A-$YF_3$, or A-$Al_2O_3$ based coatings.

These and other aspects of the present invention will become apparent to those skilled in the art after a reading of the following description of various embodiments when considered with the drawings.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Figure 1:
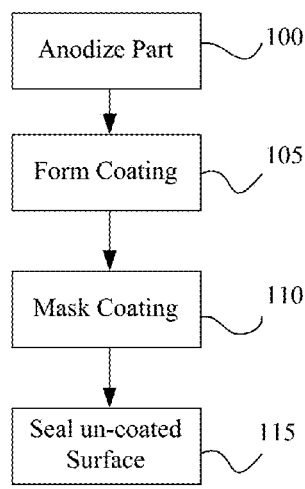
FIG. 1 is a flowchart illustrating a process according to an embodiment of the invention.

Various embodiments will now be described, providing improved coatings for plasma chamber parts, which improve erosion resistance and particle performance of the coating.

Anodization is an electrolytic passivation process used to increase the thickness of the natural oxide layer on the surface of metal parts. Anodic films are most commonly applied to protect aluminum alloys, although processes also exist for titanium, zinc, magnesium, niobium, zirconium, hafnium, and tantalum. Anodization changes the microscopic texture of the surface and changes the crystal structure of the metal near the surface. Thick coatings are normally porous and have a cellular structure, so a sealing process is often needed to achieve corrosion resistance. Anodized aluminum surfaces, for example, are harder than aluminum but have low to moderate wear resistance that can be improved with increasing thickness or by applying suitable sealing substances. It should be pointed out that the post-sealing process on the anodized surface is actually a long time immersion of the anodized part in boiling-hot deionized water or the moisture steam, such that the oxide is converted into its hydrated form, and the resulting swelling reduces the porosity of the surface. Alternatively, cold sealing can be used, where the pores are closed by impregnation of a sealant in a room-temperature bath. Anodic films are generally much stronger and more adherent than most types of paint and metal plating, but also more brittle. This makes them less likely to crack and peel from aging and wear, but more susceptible to cracking from thermal stress, which exists inside plasma chamber due to heating and cooling cycles. Usually, the post sealed anodized surface with the hydrated structure is sensitive to crack when it is in the environment with the temperature above 120° C.

Accordingly, in the prior art efforts have been made to anodize aluminum to protect aluminum parts that are exposed to plasma in a plasma processing chamber. In order to avoid particle generation, a sealing process is applied to the anodized aluminum, so as to avoid plasma species from attacking the pores in the anodization. However, since the post-sealed anodized surface of a conventionally anodized aluminum is not stable and sensitive to the service temperature, the anodized surface may crack and also cause the crack and delamination of the A-coating either during the deposition process or the thermal cycling etching process within the plasma chamber. Actually, the poor adhesion blocks the deposition of thick A-$Y_2O_3$ coating directly on the anodized aluminum chamber parts.

One of the main reasons that sealing process is applied to anodized aluminum is that the surface of anodized aluminum is rough and porous. However, in disclosed embodiments, this fact is used advantageously to enhance adhesion of the A-coating to the anodized part. That is, the coating process is performed directly after the anodization process and prior to the sealing process. It has been found that the natural rough and porous surface of the anodized aluminum enhances the adhesion of the coating. This is because the increase of surface roughness of the anodized material increases the contact area in the interfacial region between the coating and substrate surface, and changes of the coating contact area from more 2-dimensional fraction to more 3-dimensional fraction, which results in the release of the interfacial stress between the A-coating and the anodized parts, and thus the enhancement of the coating adhesion to the substrate. After the coating is completed, the anodized surface which was not coated undergoes a sealing process.

FIG. 1 illustrates a process according to an embodiment of the invention. In this example, an aluminum part having surface configured to be exposed to plasma during service is being fabricated. In step 100 the part is anodized. The anodization is of surfaces of the part that will be exposed to plasma, and optionally of surfaces that will not be exposed to plasma as well. It would be beneficial to effect an anodization process that results in an anodized surface having roughness of 12 um>Ra>4 um.

In step 105 the surfaces that will be exposed to plasma are being coated. For example, plasma spray of fine $Y_2O_3$ powder can be used for the coating. Other methods for forming the coating may include, e.g., PVD, CVD, and PECVD. In step 110 the coated surface is masked or protected, and in step 115 the uncoated but anodized surfaces are being sealed. However, the post sealing may not be required according to the service conditions on the coated parts. Sealing can be done by, e.g., long immersion in boiling-hot deionized water or steam, such that the oxide is converted into its hydrated form, and the resulting swelling reduces the porosity of the surface. Alternatively, cold sealing can be used, where the pores are closed by impregnation of a sealant in a room-temperature bath. Teflon, nickel acetate, cobalt acetate, and hot sodium or potassium dichromate seals may be used.

Figure 2A:
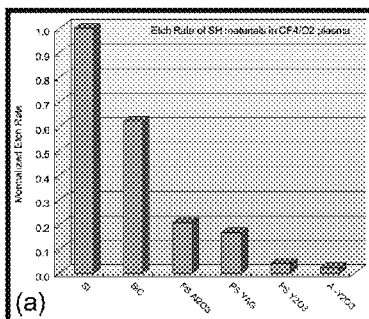
FIG. 2(a) is a plot showing the normalized erosion rates of showerhead materials measured from showerhead surface, while the showerhead materials are eroded by $CF_4/O_2$ based plasma.
Figure 2B:
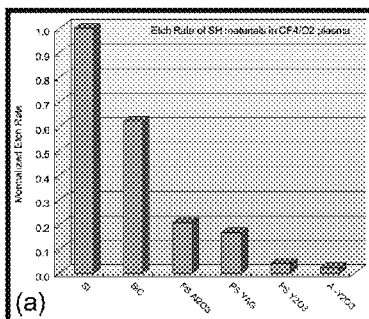
FIGS. 2(b)-2(d) are micrographs showing the morphologies of A-$Y_2O_3$ coatings deposited on the anodized aluminum alloys surfaces.
Figure 2C:
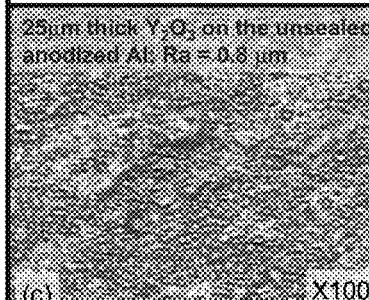
Figure 2D:
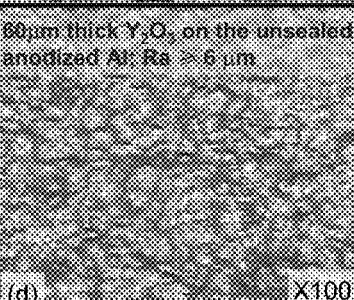

The described process has been used to coat the surface of showerhead, both sealed and un-sealed, and the resulting coating has been investigated. FIG. 2(a) shows the normalized erosion rates of showerhead materials measured from showerhead surface, while the showerhead materials are eroded by CF4/O2 based plasma. The coating produced according to the method of FIG. 1 is referred to as A-$Y_2O_3$. It can be seen that A-$Y_2O_3$ coating has the lowest erosion rate and thus the most stable structure in etching process. FIG. 2(b) shows the cracked A-$Y_2O_3$ coating of 25 um thick deposited on the sealed anodized Al 6061. However, no crack is observed on A-$Y_2O_3$ coating of 25 um thick deposited on the un-sealed hard anodized Al6061, as the image shows in FIG. 2(c). FIG. 2(d) shows a rough but not cracked surface of A-$Y_2O_3$ of 60 um thick deposited on the un-sealed anodized Al 6061 that has a surface Ra≥6 um. The data presented in FIGS. 2(a) and 2(d) show the improvements on the structure stability of A-$Y_2O_3$ on the un-sealed and rough anodized surface.

According to other embodiments, the coating is formed through the atomic deposition, rather than the particle deposition (which is the case for plasma spray). In the atomic deposition, the coating is formed in vacuum (plasma spray is formed in atmospheric environment) and the coating is condensed by atoms or radicals, rather than that by particles. In the present inventions, the coating is formed using processes such as plasma enhanced physical vapor deposition (PEPVD).

Figures 3A, 3B, 3C, 3D:
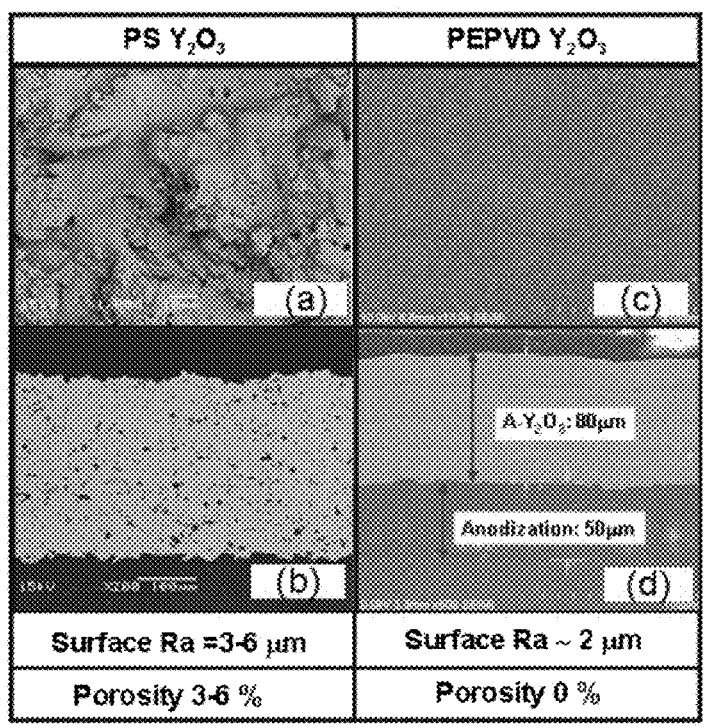
FIGS. 3(a)-3(b) are micrographs showing the rough surface and a porous cross-sectional structure of PS $Y_2O_3$ coating.
FIGS. 3(c)-3(d) are micrographs showing the smooth surface and the porous free and dense cross-sectional structure of A-$Y_2O_3$ coating deposited on anodized aluminum alloys by PEPVD.

As with the embodiment of FIG. 1, the atomic deposition is formed over an anodized, but un-sealed surface. FIGS. 3(a)-3(b) show the rough surfaces and a porous cross-sectional structure of plasma spray $Y_2O_3$ coating, and FIGS. 3(c)-3(d) show the smooth surface and the porous free and dense cross-sectional structure of A-$Y_2O_3$ coating, deposited by PEPVD. As can be seen from FIGS. 3(c)-3(d), the resulting coating has surface roughness of around 2 um and zero porosity, i.e., less than the 3% porosity of plasma spray coating. Note that the multi-layered coating shown in FIG. 3(d) has a thickness of 80 um, yet is crack free. The coatings in FIG. 3 are formed on an anodized layer that is converted from Al substrate.

Figure 4:
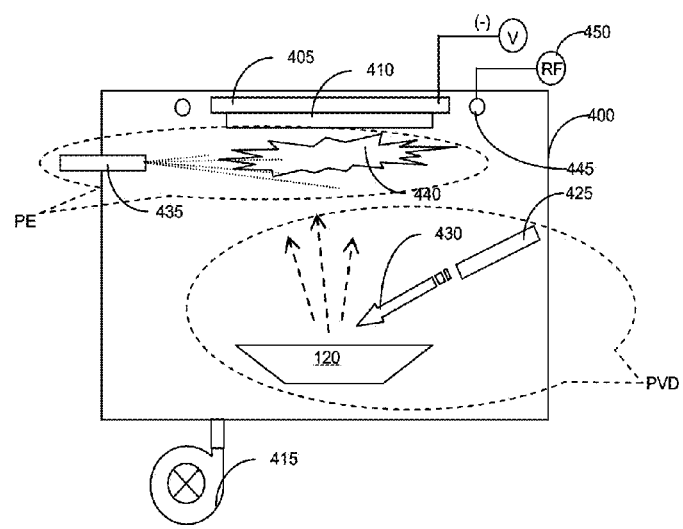
FIG. 4 illustrates an apparatus for depositing advanced coating in accordance with one embodiment of the invention.

According to yet another embodiment, a special form of atomic deposition is used to form an advanced coating. FIG. 4 illustrates an apparatus for depositing A-coating in accordance with one embodiment of the invention. This apparatus is used for depositing the A-coating using the process referred to herein as PEPVD, where the PE and PVD components are highlighted by the broken-line callouts in FIG. 4. Traditionally, chemical vapor deposition (CVD) or plasma enhanced chemical vapor deposition (PECVD) refer to a chemical process where a thin film is formed on the substrate's surface by exposing the substrate to one or more volatile precursors, which react and/or decompose on the substrate surface to produce the desired deposited film. PVD, on the other hand, refers to a coating method which involves purely physical processes, where thin films are deposited on the surface of the substrate by the condensation of a vaporized or sputtered form of the desired film material. Therefore, one may characterize PEPVD as somewhat of a hybrid of these two processes. That is, the disclosed PEPVD involves both physical process of vapor condensation (the PVD part) and chemical reaction in the chamber and on the substrate's surface (the PE part).

In FIG. 4, chamber 400 is evacuated by vacuum pump 415. The part 410 to be coated, in this example the showerhead, but it can be any other part to be coated, is attached to a holder 405. Also, a negative bias is applied to the part 410, via holder 405.

A source material 420 containing species to be deposited is provided, generally in a solid form. For example, if the film to be deposited is $Y_2O_3$ or $YF_3$, source material 420 would include Yttrium (or fluorine)—possibly with other materials, such as oxygen, fluorine (yttrium), etc. To form the physical deposition, the source material is evaporated or sputtered. In the example of FIG. 4, the evaporation is achieved using electron gun 425, directing electron beam 430 onto the source material 420. As the source material is evaporated, atoms and molecules drift towards and condense on the part 410 to be coated, as illustrated by the broken-line arrows.

The plasma enhanced part is composed of a gas injector 435, which injects into chamber 400 reactive and non-reactive source gases, such as argon, oxygen, fluorine containing gas, etc., as illustrated by the dotted lines. Plasma 440 is sustained in front of part 410, using plasma sources, e.g., RF, microwave, etc., one of which in this example is shown by coil 445 coupled to RF source 450. Without being bound by theory, it is believed that several processes take place in the PE part. First, non-reactive ionized gas species, such as argon, impinging the part 410, so as to condense the film as it is being "built up." The effects of ion impinging may result from the negative bias on showerhead 410 and showerhead holder 405, or from the ions emitted out from the plasma sources and aimed at showerhead 410. Second, reactive gas species, such as oxygen or fluorine, react with the evaporated or sputtered source material, either inside the chamber or on the surface of the part 410. For example, the source Yttrium reacts with the oxygen gas to result in Yttria coating. Thus, the resulting process has both a physical (impingement and condensation) component and a chemical component (ionization and oxidation).

Figure 5A:
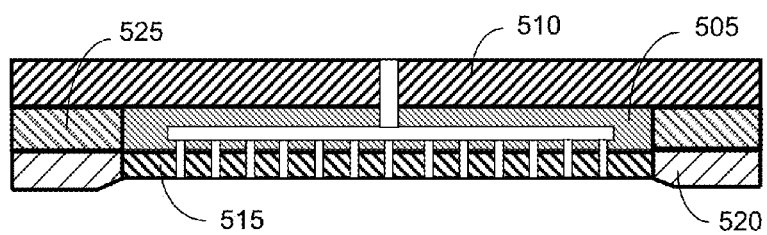
FIG. 5A illustrates a conventional showerhead and electrode assembly for a plasma chamber.

FIG. 5A illustrates a conventional showerhead and electrode assembly for a plasma chamber. Conductive plate 505, sometimes, can be converted as the heater to control the temperature of the showerhead, is sandwiched between back plate 510 and perforated plate 515. Conductive ring 520 surrounds the perforated plate 515 and works as the assistant electrode. Support ring (sometimes also referred to as grounding ring) 525 is also sandwiched between conductive ring 520 and back plate 510. Perforated plate 515, actually working as a gas distribution plate (or GDP), may be made of ceramic, quartz, etc., for example, it may be made of silicon carbide, and may be assembled to the lower surface of conductive plate 505. Conductive ring 520 may be made of ceramic, quartz, etc., for example, it may be made of silicon carbide, and may be assembled to the lower surface of support ring 525. The support ring 525, the conductive plate 505 and the back plate 510 may be made of metal, e.g., aluminum, stainless steel, etc. The showerhead is affixed to the ceiling of the plasma chamber, in a well-known manner.

Figure 5B:
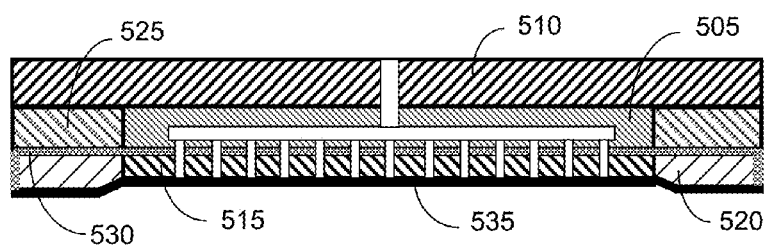
FIG. 5B illustrates a showerhead having generally the same structure as that of FIG. 5A, except that it includes the advance coating according to an embodiment of the invention.

FIG. 5B illustrates a showerhead having generally the same structure as that of FIG. 5A, except that it includes the advance coating according to an embodiment of the invention. In FIG. 5B the advanced coating 535 (for example, A-$Y_2O_3$) is provided on the bottom surfaces of the perforated plate and the conductive ring 520, i.e., the surfaces that face the plasma during substrate processing. In this embodiment, the perforated plate and the conductive ring are fabricated according to standard procedures, using aluminum alloy. The perforated plate and the conductive ring are anodized, but not sealed. Then, the perforate plate and the conductive ring are inserted into a PEPVD chamber together or separately, and the bottom surfaces of the perforated plate and the conductive ring are coated with advanced coating. The coated surfaces are then masked and a sealant is applied to the anodized but un-coated surfaces of the conductive ring 525, to result in anodized, sealed surface 530. Alternatively, at least a bottom section of the support ring 520 is coated with $Y_2O_3$, while the remaining surface of the support ring 520 is anodized and sealed. As the same procedure happens to the perforate plate, the un-coated but anodized surfaces are sealed as the sealed surface 530.

Figure 5C:
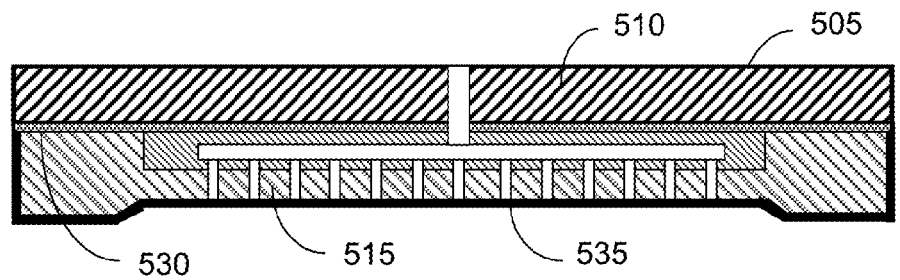
FIG. 5C illustrates another embodiment, where the showerhead assembly has one piece gas distribution plate that has the A-coating on the bottom and side surfaces and the anodized back surface.

FIG. 5C illustrates a showerhead having the modified structure as comparing to that of FIG. 5B, and having the advance coating according to an embodiment of the invention. In FIG. 5C, the perforated plate 515, conductive ring 520 and support ring 525 in former embodiment are united as one piece perforated plate or gas distribution plate (GDP) 515 in this embodiment. As quite different from the prior art in FIG. 5A, the one piece perforated plate 515 can be made of metals, for instance, aluminum alloy, and the advanced coating 535 (for example, A-$Y_2O_3$) is provided to protect the surfaces of the perforated plate, i.e., the surfaces that faces the plasma during plasma and/or etching processing. As comparing to the prior art, the formation of showerhead by A-$Y_2O_3$ coating 535 over the perforated plate 515 can reduce the product cost, simplifies the assembly and manufacture procedure of shower head, and increase the work life time. Another advantage is that it is possible to refurbish the used showerhead simply by the re-deposition of A-coating 535 over the one piece perforate plate 515. The perforated plate 515 is anodized, but not sealed. Then, the perforated plate 515 is inserted into a PEPVD chamber, and the bottom surface and side surface of the perforated plate 515 are coated with advanced coating. The coated surfaces are then masked and a sealant is applied to the anodized but un-coated backside surface of perforated plate 515. Alternatively, as in another embodiment, at least a bottom and side surfaces of the showerhead formed by the assembly of one piece perforated plate 515 with the conductive plate 505 and back plate 510 is coated with A-$Y_2O_3$, while the remaining surfaces that are not facing to plasma are anodized and sealed. Since the deposition of A-coating is directly on the anodized surface, there is no interfacial issue between A-coating and anodization, which usually exists between the plasma sprayed $Y_2O_3$ coating and the anodized surface as the plasma sprayed $Y_2O_3$ is normally deposited on the bare Al surface of the chamber parts.

Since the PEPVD coating uses atoms for buildup of the coating, the interior of the gas injection holes is also coated. However, unlike prior art PS coating, the advance coating is formed by the condensation of atoms and radicals, and results in a dense and smooth A-coating with the good adhesion to the interior surface of the gas holes, thereby providing smooth gas flow and avoiding any particle generation.

Figure 6:
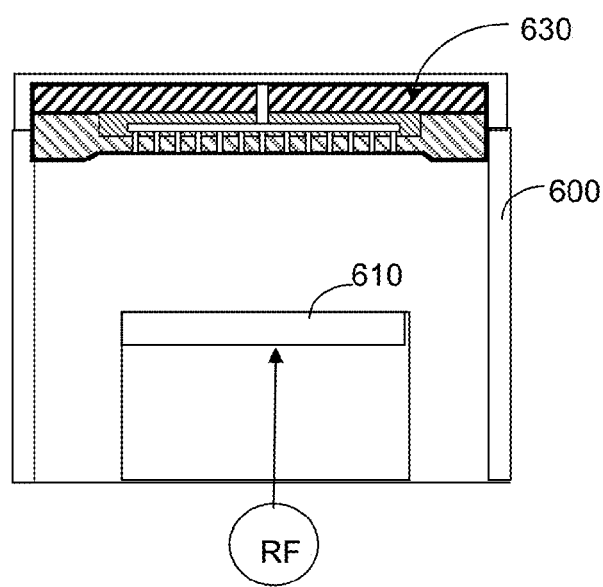
FIG. 6 illustrates a plasma chamber incorporating a showerhead according to an embodiment of the invention.

FIG. 6 illustrates a plasma chamber where a showerhead according to any of the embodiments disclosed herein is affixed to the ceiling thereof. The chamber body 600 forms a hermetic seal for evacuation of the chamber. The substrate to be processed is placed on the chuck 610, and RF power is applied, in this example to the electrode within the chuck 610. The showerhead 630 is used to inject process gas into the chamber and to functions as an electrode to provide either ground path or RF potential path.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A part to be used inside a plasma processing chamber, comprising:
    a part body having an anodized exterior surface;
    a yttrium-containing coating formed directly on an unsealed section of the anodized exterior surface; and,
    a sealant formed on a section of the anodized exterior surface which is not covered by the yttrium-containing coating.

2. The part of claim 1, wherein the anodized exterior surface has roughness of 4 μm<Ra<12 μm.

3. The part of claim 1, wherein the yttrium-containing coating comprises a yttria coating.

4. The part of claim 3, wherein the yttria coating has a surface roughness of Ra>1.0 μm, porosity of less than 1%, and a multi-layered structure.

5. The part of claim 1, wherein the part comprises a showerhead, the yttrium-containing coating comprises a yttria coating, and wherein the yttria coating has a surface roughness of Ra>1.0 μm, porosity of less than 1%, and a multi-layered structure.

6. The part of claim 1, wherein the yttrium-containing coating has a random crystal orientation created by plasma enhanced physical vapor deposition.

7. The part of claim 1, wherein the yttrium-containing coating comprises one of $Y_2O_3$ or $YF_3$.

8. The part of claim 1, wherein the sealant comprises hydrated anodized aluminum.

9. The part of claim 1, wherein the sealant comprises anodized aluminum impregnated with a sealant material.

10. The part of claim 5, wherein the unsealed section of the anodized exterior surface has roughness of 12 μm>Ra>4 μm.

11. The part of claim 1, wherein the sealant comprises one of: Teflon, nickel acetate, cobalt acetate, sodium or potassium dichromate.

12. The part of claim 1, wherein:
    the unsealed section of the anodized exterior surface has roughness of 12 μm>Ra>4 μm;
    the yttrium-containing coating comprises a yttria coating; and,
    the yttria coating has a surface roughness of Ra>1.0 μm and porosity of less than 1%.

13. The part of claim 12, wherein the sealant comprises one of hydrated anodized aluminum or anodized aluminum impregnated with a sealant material.

14. The part of claim 13, wherein the sealant material comprises one of: Teflon, nickel acetate, cobalt acetate, sodium or potassium dichromate.

15. The part of claim 1, wherein:
    the unsealed section of the anodized exterior surface has roughness of 12 μm>Ra>4 μm;
    the yttrium-containing coating comprises one of $Y_2O_3$ or $YF_3$; and,
    the sealant comprises one of hydrated anodized aluminum or anodized aluminum impregnated with a sealant material.

16. The part of claim 15, wherein the sealant material comprises one of: Teflon, nickel acetate, cobalt acetate, sodium or potassium dichromate.

17. A part of claim 15, wherein the yttrium-containing coating comprises one of $Y_2O_3$ or $YF_3$ formed by process of plasma enhanced physical vapor deposition.

18. The part of claim 17, wherein the yttrium-containing coating has a surface roughness of Ra>1.0 μm and porosity of less than 1%.

* * * * *